(12) United States Patent
Lee et al.

(10) Patent No.: US 7,667,339 B2
(45) Date of Patent: Feb. 23, 2010

(54) EPOXY RESIN COMPOSITION FOR SEMICONDUCTOR ENCAPSULATION AND SEMICONDUCTOR DEVICE USING THE SAME

(75) Inventors: Eun Jung Lee, Incheon-si (KR); Yoon Kok Park, Suwon-si (KR); Young Kyun Lee, Seoul (KR); Whan Gun Kim, Seoul (KR); Suk Ku Chang, Yongin-si (KR)

(73) Assignee: Cheil Industries, Inc., Gumi-so, Gyeongsangbuk-do (KR)

( * ) Notice: Subject to any disclaimer, the term of this patent is extended or adjusted under 35 U.S.C. 154(b) by 396 days.

(21) Appl. No.: 11/647,384

(22) Filed: Dec. 29, 2006

(65) Prior Publication Data

US 2007/0213476 A1   Sep. 13, 2007

(30) Foreign Application Priority Data

Mar. 13, 2006   (KR) .................. 10-2006-0022945
Mar. 13, 2006   (KR) .................. 10-2006-0022946

(51) Int. Cl.
*H01L 23/29* (2006.01)
*C08L 63/00* (2006.01)
*B32B 27/04* (2006.01)
*B32B 27/20* (2006.01)
*B32B 27/26* (2006.01)
*B32B 27/38* (2006.01)

(52) U.S. Cl. .............. 257/793; 257/787; 257/788; 257/789; 257/795; 428/413; 523/440; 523/443; 523/456; 523/461; 523/466

(58) Field of Classification Search .......... None
See application file for complete search history.

(56) References Cited

U.S. PATENT DOCUMENTS 4,624,912 A * 11/1986 Zweifel et al. .............. 430/258
4,631,306 A * 12/1986 Markert et al. ............. 523/457
5,541,000 A *  7/1996 Hardy et al. ................ 428/413

FOREIGN PATENT DOCUMENTS

| JP | 05-156126 | * | 6/1993 |
| JP | 6-271653 | | 9/1994 |
| JP | 6-322073 | | 11/1994 |
| JP | 6-326220 | | 11/1994 |

OTHER PUBLICATIONS

Derwent abstract of JP 05-156126.*
Machine translation of JP 05-156126, provided by the JPO website.*
Ryu, Je Hong, et al., Latent Catalyst Effects in Halogen-Free Epoxy.
Ryu, Je Hong, et al., "Latent Catalyst Effects in Halogen-Free Epoxy Molding Compounds for Semiconductor Encapsulation", Journal of Applied Polymer Science, vol. 96, pp. 2287-2299 (2005).

* cited by examiner

*Primary Examiner*—Michael J Feely
(74) *Attorney, Agent, or Firm*—Lee & Morse, P.C.

(57) ABSTRACT

An epoxy resin composition for semiconductor encapsulation includes at least one epoxy resin, at least one curing agent, at least one filler, and at least one first curing accelerator, the first curing accelerator having a tetracyanoethylene, a 7,7,8,8-tetracyanoquinodimethane, a compound having the chemical structure of Formula 1, or a mixture thereof,

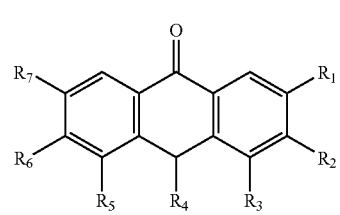

[Formula 1]

wherein each of $R_1$ through $R_7$, independently, represents a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ can be joined to each other to form a cyclic structure.

19 Claims, No Drawings

EPOXY RESIN COMPOSITION FOR SEMICONDUCTOR ENCAPSULATION AND SEMICONDUCTOR DEVICE USING THE SAME

BACKGROUND OF THE INVENTION

1. Field of the Invention

The present invention relates to an epoxy resin composition for semiconductor encapsulation. In particular, the present invention relates to an epoxy resin composition for semiconductor encapsulation exhibiting good flowability and excellent curing properties.

2. Description of the Related Art

Recent developments in high-density and automatic technology for mounting semiconductor packages on printed boards have induced surface mounting techniques, where semiconductor packages may be directly soldered onto a surface of a printed board instead of being attached thereto by lead pins. Such mounting techniques have triggered the use of flat plastic packages (FPPs) suitable for high-density and surface mounting instead of conventional dual inline packages (DIPs). The flat plastic packages may have an increased size and number of pins due to improved microprocessing technology, i.e., improved integration of semiconductors. Conventional surface mounting techniques may require enhanced moldability of semiconductor packages in order to reduce the occurrence of molding defects, e.g., incomplete filling of the packages, formation of voids, and so forth, during packaging in order to increase productivity. A conventional semiconductor molding technique may include use of epoxy resins.

Epoxy resins may be utilized in various applications, including adhesives and electrically insulating materials, due to their high heat and moisture resistance, excellent electrical properties and good adhesiveness. Particularly, epoxy resins may be useful in molding electronic circuit components, e.g., semiconductors. Semiconductors may be molded by hermetic molding techniques, e.g., using metals and ceramics, and resin molding techniques, e.g., using phenol, silicone and epoxy resins. Conventional resin molding techniques using epoxy resins may be the most suitable in terms of economic efficiency, productivity and physical properties. In particular, a conventional semiconductor molding technique may include forming an epoxy resin molding material into a tablet and, subsequently, molding the semiconductor with the tablet via a low-pressure transfer molding machine.

Conventional epoxy resin molding materials may be at a B-stage state, i.e., a material in a half-cured state that may be kept at room temperature for several days or stored at low temperature for a long period of time to complete curing. However, such curing of B-stage epoxy resin molding material may result in poor moldability due to a difference in thermal hysteresis between the surface and the inside of the epoxy resin material at relatively low temperatures. In particular, use of such epoxy resin molding materials in semiconductor molding may trigger outer defects, e.g., incomplete filling, voids, pinholes, and so forth, and internal defects, e.g., deformation of gold lines, internal voids, and so forth, and, thereby, reduce semiconductor reliability, e.g., decrease moisture resistance reliability and minimized soldering heat resistance.

In an attempt to improve molding properties of epoxy resin materials, curing accelerators have been suggested to improve moldability of epoxy resin materials for semiconductor encapsulation without deterioration in production efficiency.

Additionally, high degree inorganic fillers have been suggested for use in epoxy resin materials to improve the density and heat and moisture resistance of the semiconductor devices. Accordingly, low-viscosity epoxy resins, e.g., biphenyl type epoxy resins, and self-extinguishable resins, i.e., environmentally friendly epoxy resin compositions, may be used instead of novolac type epoxy resins and phenolic resins. However, such biphenyl epoxy resins and self-extinguishable resins may be less reactive than novolac type epoxy resins and phenolic resins. Reduced reactivity may cause incomplete curing reactions when conventional curing accelerators are used, thereby triggering deterioration of semiconductor moldability, curing properties and storage stability.

Accordingly, there is a need for a new epoxy resin composition capable of exhibiting high reactivity and good storage stability, while maintaining good molding properties, density, and heat and moisture resistance of a semiconductor device.

SUMMARY OF THE INVENTION

The present invention is therefore directed to an epoxy resin composition for semiconductor encapsulation and a semiconductor using the same, which substantially overcome one or more of the disadvantages of the related art.

It is therefore a feature of the present invention to provide an epoxy resin composition for semiconductor encapsulation that exhibits high reactivity and good storage stability.

It is another feature of the present invention to provide an epoxy resin composition for semiconductor encapsulation that exhibits improved moldability and excellent curing properties for semiconductor encapsulation.

It is yet another feature of the present invention to provide a semiconductor device using an epoxy resin composition having one or more of the above features.

At least one of the above and other features and advantages of the present invention may be realized by providing an epoxy resin composition for semiconductor encapsulation, comprising at least one epoxy resin, at least one curing agent, at least one filler, and at least one first curing accelerator, the first curing accelerator including a tetracyanoethylene, a 7,7,8,8-tetracyanoquinodimethane, a compound having the chemical structure of Formula 1, or a mixture thereof,

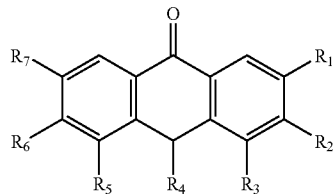

[Formula 1]

wherein each of $R_1$ through $R_7$, independently, represents a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ can be joined to each other to form a cyclic structure. The epoxy resin composition may be used in a semiconductor device.

The first curing accelerator may include a mixture of at least two compounds having the chemical structure of Formula 1. Alternatively, the first curing accelerator may include a mixture of tetracyanoethylene and 7,7,8,8-tetracyanoquinodimethane. In yet another alternative, the first curing accelerator may include a reaction product of the at least one curing agent with a compound selected from the compounds of Formula 1, the tetracyanoethylene or the 7,7,8,8-tetracyanoquinodimethane.

In still another alternative, the first curing accelerator may include a reaction product of a second curing accelerator with the tetracyanoethylene, the 7,7,8,8-tetracyanoquinodimethane, or the compound having the chemical structure of Formula 1. The second curing accelerator may be a triphenylphosphine or a triphenylphosphine derivative. The triphenylphosphine derivative may be triphenylphosphine oxide, butyltriphenylphosphonium bromide, triphenylphosphine triphenylborane, or a mixture thereof. Additionally, the reaction product may include at least one curing agent.

The first curing accelerator may be present in the epoxy resin composition in an amount of about 0.1% to about 10% by weight of the epoxy resin composition. The tetracyanoethylene, the 7,7,8,8-tetracyanoquinodimethane, the compound having the chemical structure of Formula 1, or a mixture thereof may be present in the first curing accelerator in an amount of about 5% to about 95% by weight of the total curing accelerator.

The epoxy resin may include a biphenyl type epoxy resin having a chemical structure represented by Formula 4 below, wherein n is in a range of 0 to 7.

filler may be present in the epoxy resin composition in an amount of about 70% to about 95% by weight of the epoxy resin composition.

DETAILED DESCRIPTION OF THE INVENTION

Korean Patent Applications Nos. 10-2006-0022945 and 10-2006-0022946, both filed on Mar. 13, 2006, in the Korean Intellectual Property Office, and entitled: "Epoxy Resin Composition for Semiconductor Encapsulation and Semiconductor Device Using the Same," are incorporated by reference herein in their entirety.

An exemplary embodiment of an epoxy resin composition for semiconductor encapsulation according to the present invention will now be described in more detail. The epoxy resin composition according to an embodiment of the present invention may be used to encapsulate semiconductor devices, such as copper-based lead frames, iron-based lead frames, and organic-based laminate frames. However, other semiconductor devices are not excluded from the scope of the present invention.

The epoxy resin composition according to an embodiment of the present invention may include at least one epoxy resin, at least one curing agent, at least one filler, at least one first

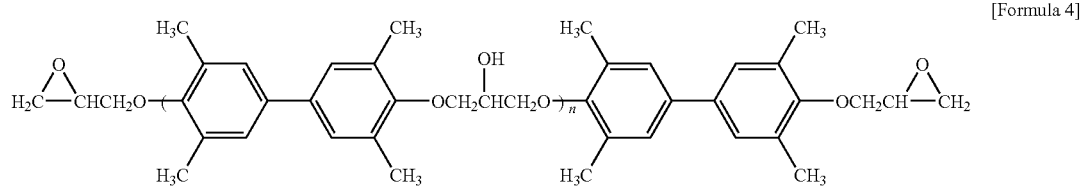

[Formula 4]

The biphenyl type epoxy resin may be present in the epoxy resin composition in an amount of at least about 40% by weight of the total epoxy resin. The biphenyl type epoxy resin may be present in the epoxy resin composition in an amount of at least about 70% by weight of the total epoxy resin.

The curing agent may include a phenolaralkyl type phenolic resin having a chemical structure represented by Formula 6, wherein n is in a range of 1 to 7.

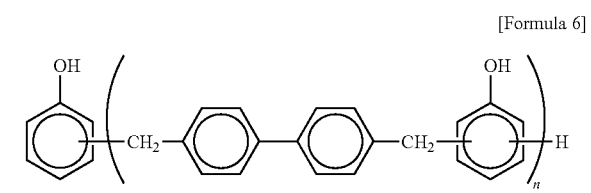

[Formula 6]

The phenolaralkyl type phenolic resin may be present in the epoxy resin composition in an amount of about 20% by weight of the total curing agent. The phenolaralkyl type phenolic resin may be present in the epoxy resin composition in an amount of about 30% of the total curing agent.

The filler may include silica in an amount of about 40% by weight of the total filler. The silica may include about 50% to about 99% by weight of spherical fused silica having an average particle diameter of about 5 μm to about 30 μm, and about 1% to about 50% by weight of spherical fused silica having an average particle diameter of about 1 μm or less. The curing accelerator including at least one compound having a chemical structure represented by Formula 1, tetracyanoethylene as represented by Formula 2, 7,7,8,8-tetracyanoquinodimethane as represented by Formula 3, or a mixture thereof:

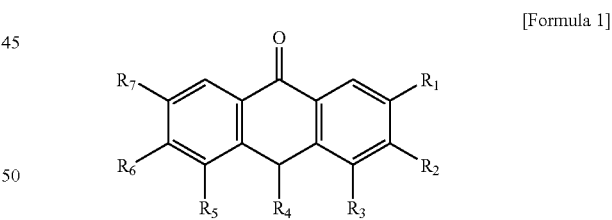

[Formula 1]

wherein each of $R_1$ through $R_7$, which may be identical to or different from each other, may, independently, represent a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ may be joined to each other to form a cyclic structure;

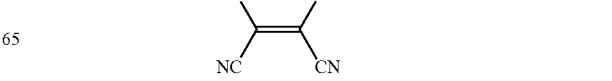

[Formula 2]

[Formula 3]

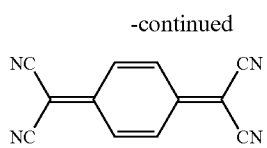

Examples of suitable epoxy resins of the epoxy resin composition according to an embodiment of the present invention may include cresol novolac type epoxy resins, phenol novolac type epoxy resins, biphenyl type epoxy resins, bisphenol A type epoxy resins, bisphenol F type epoxy resins, linear aliphatic epoxy resins, alicyclic epoxy resins, heterocyclic epoxy resins, epoxy resins having a Spiro ring, xylok type epoxy resins, phenolaralkyl type epoxy resins, or mixtures thereof. Preferred epoxy resins may be a biphenyl type epoxy resin and a phenolaralkyl type epoxy resin as represented by Formulas 4 and 5, respectively:

composition of the present invention, the biphenyl type epoxy resin of Formula 4 may be used in an amount of at least about 40% by weight of the total epoxy resins. More preferably, the biphenyl type epoxy resin of Formula 4 may be used in an amount of at least about 70% by weight of the total epoxy resins. An adduct of the biphenyl type epoxy resin, i.e. a partial reaction product of the biphenyl type epoxy resin, may be used. The total epoxy resins may be present in the epoxy resin composition in an amount of about 3% to about 15% by weight.

Examples of curing agents of the epoxy resin composition according to an embodiment of the present invention may include novolac resins synthesized from phenol novolac resins, cresol novolac resins and bisphenol A and resol; polyhydric phenolic compounds, e.g., tris(hydroxyphenyl)methane, dihydroxybiphenyl, and so forth; acid anhydrides, e.g., maleic anhydride, phthalic anhydride, and so forth; aromatic amines, e.g., meta-phenylenediamine, diaminodiphenyl-

[Formula 4]

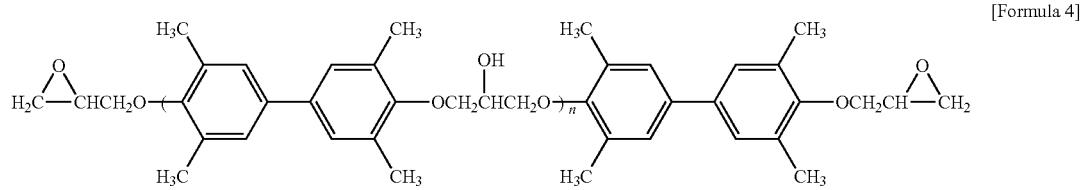

wherein n is in a range of 0 to 7;

[Formula 5]

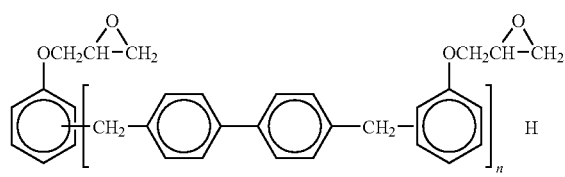

wherein n is in a range of 1 to 7. As used herein, unless otherwise specified, n may be a positive integer or real number for the Formulas described herein. For example, Formula 4 may include a mixture of material having varying values of n, such that n in a range of 0 to 7 may include, e.g., n being an average of 0 to 7, Formula 5 may likewise have a value of n that is an average, etc.

The biphenyl type epoxy resin of Formula 4 may be used as a single epoxy resin in the epoxy resin composition of the present invention or it may be used as one component of an epoxy resin mixture, i.e., a mixture of at least two epoxy resins. If more than one epoxy resin is used in the epoxy resin methane, diaminodiphenylsulfone, and so forth; or mixtures thereof. Phenolic curing agents may be mainly used for semiconductor molding to improve heat resistance, moisture resistance and storage stability.

The curing agents may be used to react with the epoxy resins to facilitate formation of cured products. It may be desirable to use two kinds of curing agents. For example, a phenolaralkyl type phenolic resin and a xylok type phenolic resin, as represented by Formulas 6 and 7, respectively, may be used.

[Formula 6]

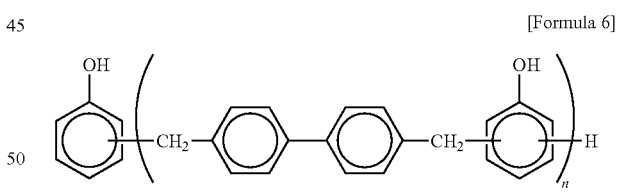

wherein n is in a range of 1 to 7;

[Formula 7]

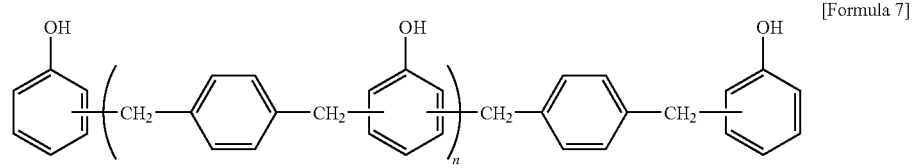

wherein n is in a range of 1 to 7.

If the phenolaralkyl type phenolic resin is used in the epoxy resin composition with an another phenolic curing agent, the phenolaralkyl type phenolic resin may be used in an amount of at least about 20% by weight of the total phenolic resins, and preferably, in an amount of at least about 30% by weight of the total phenolic resins. The total amount of curing agents in the epoxy resin composition may be about 0.1% to about 10% by weight of the epoxy resin composition, and more preferably in an amount of about 0.5% to about 7% by weight of the epoxy resin composition. The chemical equivalent ratio of the epoxy resins to the curing agents in the epoxy resin composition may vary from about 0.5:1 to about 1.5:1 and, more preferably, from about 0.8:1 to about 1.2:1, with respect to required mechanical properties and moisture resistance reliability of the epoxy resin composition.

The fillers of the epoxy resin composition according to an embodiment of the present invention may improve the mechanical properties, e.g., low stress, of the epoxy resin composition. The amount of fillers in the epoxy resin composition may be determined with respect to the intended physical properties, e.g., moldability, low stress and high-temperature strength, of the epoxy resin composition. In particular, the amount of fillers in the epoxy resin composition may be from about 70% to about 95% and, preferably, from about 80% to about 95% by weight of the epoxy resin composition. Examples of fillers may include fused silica, crystalline silica, calcium carbonate, magnesium carbonate, alumina, magnesia, clay, talc, calcium silicate, titanium oxide, antimony oxide, glass fiber, or a combination thereof. Fused silica, for example, may be a preferred epoxy resin composition filler to provide low-stress properties thereto due to its low coefficient of linear expansion.

The fused silica may refer to amorphous silica having a true specific gravity of about 2.3 or less. The amorphous silica may be prepared by melting crystalline silica or by synthesis from various raw materials. The shape and particle diameter of the fused silica may not be particularly restricted. For example, the fused silica of the epoxy resin composition may include from about 50% to about 99% by weight of spherical fused silica having an average particle diameter of about 5 μm to about 30 μm and from about 1% to 50% by weight of spherical fused silica having an average particle diameter of about 1 μm or less. The amount of fused silica may be at least about 40% and, preferably, at least about 60% by weight of the total fillers.

Curing accelerators may induce a reaction between the epoxy resins and the curing agents. Known examples of conventional curing accelerators, i.e., second curing accelerator, may include tertiary amines, e.g., benzyldimethylamine, 2-2-(dimethylaminomethyl)phenol, salts of 2,4,6-tris(diaminomethyl)phenol, tri-2-ethylhexanoic acid, and so forth; organometallic compounds, e.g., chromium acetylacetonate, zinc acetylacetonate, nickel acetylacetonate, and so forth; organic phosphorus compounds, e.g., tris-4-methoxyphosphine, tetrabutylphosphonium bromide, butyltriphenylphosphonium bromide, triphenyl-phosphine, triphenylphosphine triphenylborane, triphenyl-phosphine-1,4-benzoquinone adducts, and so forth; imidazole compounds, e.g., 2-methylimidazole, 2-aminoimidazole, 2-methyl-1-vinylimidazole, 2-ethyl-4-methylimidazole, 2-heptadecylimidazole, and so forth; boron compounds, e.g., trifluoroborane-n-hexylamine, trifluoroborane mono-ethylamine, tetrafluoroborane triethylamine, tetrafluoroborane amine, and so forth; salts of 1,8-diazabicycloundecene (DBU), phenol novolac resins, or combinations thereof. However, these known curing accelerators may not provide sufficient improvement in the curing properties and moldability of epoxy resin compositions having low-viscosity epoxy resins.

The epoxy resin composition according to an embodiment of the present invention may include at least one compound corresponding to Formula 1, Formula 2, or Formula 3 above in order to provide improved moldability, good storage stability and excellent curing properties to the epoxy resin composition. For example, a mixture of two or more compounds of Formula 1 may be used as a first curing accelerator in the epoxy resin composition of the present invention. Alternatively, a mixture of tetracyanoethylene and 7,7,8,8-tetracyanoquinodimethane may be used as a first curing accelerator in the epoxy resin composition of the present invention. In yet another alternative, an adduct of the compound selected from compounds of Formula 1, tetracyanoethylene of Formula 2 and 7,7,8,8-tetracyanoquinodimethane of Formula 3 with a known curing accelerator, e.g., triphenylphosphine or a triphenylphosphine derivative, may be used as a curing accelerator in the epoxy resin composition of the present invention. Examples of triphenylphosphine derivatives may include triphenyl-phosphine oxide, butyltriphenylphosphonium bromide, triphenylphosphine triphenylborane, and mixtures thereof.

The compound selected from compounds of Formula 1, tetracyanoethylene and 7,7,8,8-tetracyanoquinodimethane may be reacted with the curing agents. Alternatively, the compound selected from compounds of Formula 1, tetracyanoethylene and 7,7,8,8-tetracyanoquinodimethane may be mixed with a curing accelerator to form an adduct that may be reacted with the curing agents. The latter may be preferred due to its high dispersability. For example, the compound selected from compounds of Formula 1, tetracyanoethylene and 7,7,8,8-tetracyanoquinodimethane may be mixed with triphenylphosphine to form an adduct and, subsequently, reacted with the curing agents.

The curing accelerators may be present in the epoxy resin composition of the present invention in an amount of about 0.1% to about 10% by weight of the epoxy resin composition. If a combination of curing accelerator is used in the epoxy resin composition, the compound selected from compounds of Formula 1, tetracyanoethylene and 7,7,8,8-tetracyanoquinodimethane may be used in an amount of about 5% to about 95% by weight of the total curing accelerators.

The epoxy resin composition according to an embodiment of the present invention may also include at least one additive as long as the object of the present invention is not impaired. The additive may include release agents, e.g., higher fatty acids, higher fatty acid metal salts, ester type waxes, and so forth; colorants, e.g., carbon black, organic dyes, inorganic dyes, and so forth; coupling agents, e.g., epoxy silane, aminosilane, alkylsilane, mercaptosilane, and so forth; and anti-stress agents, e.g., modified silicone oils, silicone powders, silicone resins, and so forth.

If silicone oil is used, it may include a highly heat-resistant silicone polymer. The silicone oil may include an epoxy group, an amine group, or a carboxyl group. Further, the silicone oil may be present in the epoxy resin composition in an amount of about 0.05% to about 1.5% by weight of the epoxy resin composition. When the silicone oil is used in an amount greater than about 1.5% by weight of the epoxy resin composition, the surface of the epoxy resin composition may be contaminated, thereby triggering lengthened resin bleed. On the other hand, when the silicone oil is used in an amount smaller than about 0.05% by weight of the epoxy resin composition, a sufficiently low modulus of elasticity may not be attained.

The epoxy resin composition according to an embodiment of the present invention may be prepared by using the above-mentioned components in accordance with the following general procedure. First, respective predetermined amounts of the components may be homogeneously and sufficiently mixed using a Henshel or Redige mixer. Next, the mixture may be melt-kneaded in a roll mill or a kneader, cooled, and pulverized into a powder form. Low-pressure transfer molding, injection molding or casting may be employed to manufacture a semiconductor device using epoxy resin composition of the present invention.

EXAMPLES

Examples 1-6

Sample epoxy resin compositions 1-6 according to an embodiment of the present invention were prepared in accordance with Table 1 below. The respective components were homogenously mixed using a Henshel mixer, melt-kneaded at 100-120° C. using a continuous kneader, cooled, and pulverized to prepare epoxy resin compositions for semiconductor molding.

Comparative Examples 1-3

Comparative sample epoxy resin compositions 1-3 were prepared in accordance with the components indicated in Table 1. The method of preparation was identical to the method used in Examples 1-6.

The physical properties of each epoxy resin composition in Examples 1-6 and Comparative Examples 1-3 were evaluated as follows, while test results are reported in Table 2 below.

Flowability of each of the compositions was evaluated by measuring the spiral flow of the composition using a transfer molding press at 175° C. in accordance with the standard procedure of EMMI-1-66.

Hot hardness of each of the compositions was determined as follows. The cured surface of the composition was measured using a Shore D type hardness tester under curing conditions for 100 seconds and 50 seconds. Then the spiral flow of the composition was measured at 175° C. The higher the hardness, the better the curability.

Storage stability of each of the compositions was evaluated by comparing a spiral flow of the composition measured after the composition was stored at 25° C. and RH 55% for 96 hours with a spiral flow of the composition measured before the composition was stored. The lower the deterioration rate, the better the storage stability.

Flexural strength of each of the compositions was measured as follows. A test specimen was produced from each sample composition in accordance with the procedure of ASTM D-790 at 175° C. and 4 hours. Next, the flexural strength of each test specimen was measured until the test specimen was broken with a three-point bending test using a universal testing machine (UTM).

TABLE 1

| Component | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Epoxy resin I[1] | 4.30 | 4.26 | 3.71 | 3.71 | 3.71 | — | 3.75 | 3.76 | 3.75 |
| Epoxy resin II[2] | — | 1.81 | 3.71 | 3.71 | 3.71 | 10.70 | 3.75 | 3.76 | 3.75 |
| Curing agent I[3] | 3.70 | 4.85 | — | — | — | — | — | — | — |
| Curing agent II[4] | — | — | 6.44 | 6.44 | 6.44 | 8.00 | 6.49 | 6.51 | 6.50 |
| TPP[5]-AT[6] Adduct | 0.20 | 0.28 | 0.34 | — | 0.17 | 0.50 | — | — | — |
| TPP-BAT[7] Adduct | — | — | — | 0.34 | 0.17 | — | — | — | — |
| TPP | — | — | — | — | — | — | 0.21 | — | — |
| 2MI[8] | — | — | — | — | — | — | — | 0.12 | — |
| DBU[9] | — | — | — | — | — | — | — | — | 0.20 |
| Filler I[10] | 45.35 | 43.85 | 42.35 | 42.35 | 42.35 | 39.85 | 42.35 | 42.35 | 42.35 |
| Filler II[11] | 36.28 | 35.08 | 33.88 | 33.88 | 33.88 | 31.88 | 33.88 | 33.88 | 33.88 |
| Filler III[12] | 9.07 | 8.77 | 8.47 | 8.47 | 8.47 | 7.97 | 8.47 | 8.47 | 8.47 |
| Silane | 0.50 | 0.50 | 0.50 | 0.50 | 0.50 | 0.50 | 0.50 | 0.50 | 0.50 |
| Carnauba Wax | 0.30 | 0.30 | 0.30 | 0.30 | 0.30 | 0.30 | 0.30 | 0.30 | 0.30 |
| Carbon Black | 0.30 | 0.30 | 0.30 | 0.30 | 0.30 | 0.30 | 0.30 | 0.30 | 0.30 |

Notes:
* All component amounts are given in [wt %] relative to the total epoxy resin composition
[1] Epoxy resin I: Biphenyl type epoxy resin (YX-4000H, JER, epoxy equivalents = 190)
[2] Epoxy resin II: Xylok type epoxy resin (Softening point: 55° C., epoxy equivalents = 250)
[3] Curing agent I: Xylok type phenolic resin (MEH-7800-4S, Meihwa Chem., hydroxyl equivalents = 175)
[4] Curing agent II: Phenolaralkyl type phenolic resin (MEH-7851-SS, Meihwa Chem., hydroxyl equivalents = 200)
[5] TPP: Triphenylphosphine
[6] AT: Anthrone
[7] BAT: Benzanthrone
[8] 2MI: 2-Methylimidazole
[9] DBU: 1,8-Diazabicycloundecene
[10] Filler I: Spherical fused silica (average particle diameter: 28 μm)
[11] Filler II: Spherical fused silica (average particle diameter: 15 μm)
[12] Filler III: Spherical fused silica (average particle diameter: 1 μm)

TABLE 2

| | Physical properties | | | | |
|---|---|---|---|---|---|
| | Spiral flow | Hot hardness | | Storage | Flexural strength |
| | (inch) | 100 (sec.) | 50 (sec.) | stability (%) | (kgf/mm²) |
| Example 1 | 31 | 72 | 54 | 13.2 | 17.5 |
| Example 2 | 47 | 75 | 63 | 9.3 | 16.4 |
| Example 3 | 42 | 78 | 68 | 8.7 | 15.8 |
| Example 4 | 44 | 73 | 60 | 9.0 | 15.9 |
| Example 5 | 42 | 74 | 60 | 9.1 | 16.0 |
| Example 6 | 83 | 72 | 58 | 10.8 | 15.4 |
| Comparative Example 1 | 36 | 65 | Uncured | 37.2 | 13.4 |
| Comparative Example 2 | 38 | 60 | Uncured | 45.1 | 14.1 |
| Comparative Example 3 | 38 | 62 | Uncured | 40.5 | 13.5 |

Examples 7-10

Sample epoxy resin compositions 7-10 according to an embodiment of the present invention were prepared in accordance with Table 3 below. The method of preparation was identical to the method used in Examples 1-6.

Comparative Examples 4-6

Comparative sample epoxy resin compositions 4-6 were prepared in accordance with the components indicated in Table 3. The method of preparation was identical to the method used in Examples 1-6.

The physical properties of each epoxy resin composition in Examples 7-10 and Comparative Examples 4-6 were evaluated in the same manner as Examples 1-6 and Comparative Examples 1-3. Test results are reported in Table 4 below.

TABLE 4

| | Physical properties | | |
|---|---|---|---|
| | Spiral flow (inch) | Storage stability (%) | Flexural strength (kgf/mm²) |
| Example 7 | 49 | 8.5 | 15.4 |
| Example 8 | 48 | 9.4 | 15.8 |
| Example 9 | 48 | 8.2 | 15.6 |
| Example 10 | 48 | 8.7 | 15.7 |
| Comparative Example 4 | 42 | 20.3 | 13.3 |
| Comparative Example 5 | 40 | 24.5 | 13.1 |
| Comparative Example 6 | 38 | 25.2 | 12.8 |

As apparent from the above description, the epoxy resin compositions according to an embodiment of the present invention may include at least one compound from compounds of Formula 1, tetracyanoethylene of Formula 2 or 7,7,8,8-tetracyanoquinodimethane Formula 3 as a curing accelerator. Such an epoxy resin composition may exhibit good flowability, high hot hardness, good storage stability and excellent mechanical properties. Therefore, the epoxy resin composition of the present invention may be advantageous in manufacturing highly moldable and reliable semiconductor devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

TABLE 3

| Component* | Example 7 | Example 8 | Example 9 | Example 10 | Comparative Example 4 | Comparative Example 5 | Comparative Example 6 |
|---|---|---|---|---|---|---|---|
| Epoxy resin I[1] | 7.91 | 6.63 | 7.88 | 6.61 | 7.94 | 7.93 | 7.94 |
| Epoxy resin II[2] | — | 1.33 | — | 1.32 | — | — | — |
| Curing agent[3] | 7.31 | 7.26 | 7.29 | 7.24 | 7.33 | 7.32 | 7.33 |
| TPP[4]-TCE[5] Adduct | 0.20 | 0.20 | — | — | — | — | — |
| TPP-TCNQ[6] Adduct | — | — | 0.25 | 0.25 | — | — | — |
| TPP | — | — | — | — | 0.15 | — | — |
| 2MI[7] | — | — | — | — | — | — | 0.15 |
| DBU[8] | — | — | — | — | — | 0.17 | — |
| Filler I[9] | 58.10 | 58.10 | 58.10 | 58.10 | 58.10 | 58.10 | 58.10 |
| Filler II[10] | 16.60 | 16.60 | 16.60 | 16.60 | 16.60 | 16.60 | 16.60 |
| Filler III[11] | 8.30 | 8.30 | 8.30 | 8.30 | 8.30 | 8.30 | 8.30 |
| Silane | 0.83 | 0.83 | 0.83 | 0.83 | 0.83 | 0.83 | 0.83 |
| Carnauba Wax | 0.45 | 0.45 | 0.45 | 0.45 | 0.45 | 0.45 | 0.45 |
| Carbon Black | 0.30 | 0.30 | 0.30 | 0.30 | 0.30 | 0.30 | 0.30 |

Notes:
*All component amounts are given in [wt %] relative to the total epoxy resin composition
[1]Epoxy resin I: Biphenyl epoxy resin (YX-4000H, JER, epoxy equivalents = 190)
[2]Epoxy resin II: Phenolaralkyl type epoxy resin (NC-3000, Nippon Kayaku, epoxy equivalents = 270)
[3]Curing agent: xylok type phenolic resin (MEH-7800-4S, Meihwa Chem., hydroxyl equivalents = 175)
[4]TPP: Triphenylphosphine
[5]TCE: Tetracyanoethylene
[6]TCNQ: Tetracyanoquinodimethane
[7]2MI: 2-Methylimidazole
[8]DBU: 1,8-Diazabicycloundecene)
[9]Filler I: Spherical fused silica (average particle diameter: 28 μm)
[10]Filler II: Spherical fused silica (average particle diameter: 6 μm)
[11]Filler III: Spherical fused silica (average particle diameter: 1 μm)

What is claimed is:

1. An epoxy resin composition for semiconductor encapsulation, comprising at least one epoxy resin, at least one curing agent, at least one filler, and at least one first curing accelerator, the first curing accelerator including a reaction product of the at least one curing agent with a compound selected from a tetracyanoethylene, a 7,7,8,8-tetracyanoquinodimethane, a compound having the chemical structure of Formula 1, or a mixture thereof,

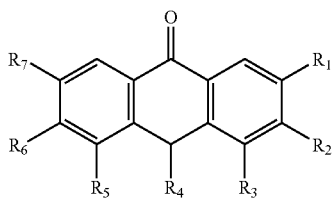

[Formula 1]

wherein each of $R_1$ through $R_7$, independently, represents a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ can be joined to each other to form a cyclic structure.

2. The epoxy resin composition as claimed in claim 1, wherein the first curing accelerator includes a reaction product of the at least one curing agent with a mixture of at least two compounds having the chemical structure of Formula 1.

3. The epoxy resin composition as claimed in claim 1, wherein the first curing accelerator includes a reaction product of the at least one curing agent with a mixture of tetracyanoethylene and 7,7,8,8-tetracyanoquinodimethane.

4. The epoxy resin composition as claimed in claim 1, wherein the first curing accelerator is present in the epoxy resin composition in an amount of about 0.1% to about 10% by weight of the epoxy resin composition.

5. The epoxy resin composition as claimed in claim 1, wherein the reaction product of the at least one curing agent with the compound selected from a tetracyanoethylene, a 7,7,8,8-tetracyanoquinodimethane, a compound having the chemical structure of Formula 1, or a mixture thereof, is present in the first curing accelerator in an amount of about 5% to about 95% by weight of the total curing accelerator.

6. The epoxy resin composition as claimed in claim 1, wherein the epoxy resin includes a biphenyl type epoxy resin having a chemical structure represented by Formula 4, wherein n is in a range of 0 to 7;

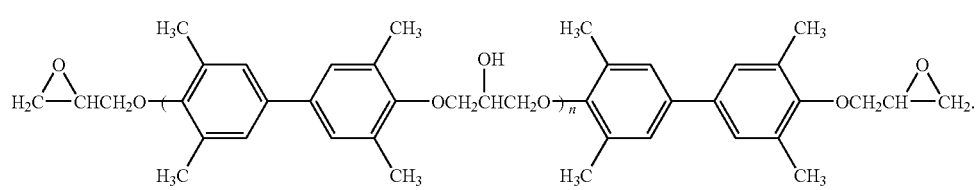

[Formula 4]

7. The epoxy resin composition as claimed in claim 6, wherein the biphenyl type epoxy resin is present in the epoxy resin composition in an amount of at least about 40% by weight of the total epoxy resin.

8. The epoxy resin composition as claimed in claim 6, wherein the biphenyl type epoxy resin is present in the epoxy resin composition in an amount of at least about 70% by weight of the total epoxy resin.

9. The epoxy resin composition as claimed in claim 1, wherein the filler includes silica in an amount of about 40% by weight of the total filler.

10. The epoxy resin composition as claimed in claim 9, wherein the silica includes about 50% to about 99% by weight of spherical fused silica having an average particle diameter of about 5 μm to about 30 μm, and about 1% to about 50% by weight of spherical fused silica having an average particle diameter of about 1 μm or less.

11. The epoxy resin composition as claimed in claim 1, wherein the filler is present in the epoxy resin composition in an amount of about 70% to about 95% by weight of the epoxy resin composition.

12. A semiconductor device encapsulated with the epoxy resin composition as claimed in claim 1.

13. An epoxy resin composition for semiconductor encapsulation, comprising at least one epoxy resin, at least one curing agent, at least one filler, and at least one first curing accelerator, the first curing accelerator including a reaction product of a second curing accelerator with a tetracyanoethylene, a 7,7,8,8-tetracyanoquinodimethane, a compound having the chemical structure of Formula 1, or a mixture thereof,

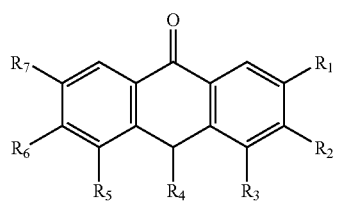

[Formula 1]

wherein each of $R_1$ through $R_7$, independently, represents a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ can be joined to each other to form a cyclic structure.

14. The epoxy resin composition as claimed in claim 13, wherein the second curing accelerator is a triphenylphosphine or a triphenylphosphine derivative.

15. The epoxy resin composition as claimed in claim 14, wherein the triphenylphosphine derivative is triphenylphosphine oxide, butyltriphenylphosphonium bromide, triphenylphosphine triphenylborane, or a mixture thereof.

16. The epoxy resin composition as claimed in claim 13, wherein the reaction product included in the first curing accelerator is a reaction product of the second curing accelerator with at least one curing agent and with the compound selected from a tetracyanoethylene, a 7,7,8,8-tetracyanoquinodimethane, a compound having the chemical structure of Formula 1, or a mixture thereof.

17. An epoxy resin composition for semiconductor encapsulation, comprising at least one epoxy resin, at least one curing agent, at least one filler, and at least one first curing accelerator, the first curing accelerator including a tetracyanoethylene, a 7,7,8,8-tetracyanoquinodimethane, a compound having the chemical structure of Formula 1, or a mixture thereof,

[Formula 1]

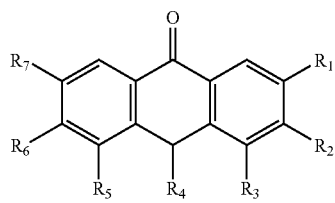

wherein each of $R_1$ through $R_7$, independently, represents a hydrogen atom or a $C_1$-$C_{12}$ hydrocarbon group, provided that when $R_1$ through $R_7$ are $C_1$-$C_{12}$ hydrocarbon groups, $R_1$ and $R_2$, $R_2$ and $R_3$, $R_3$ and $R_4$, $R_4$ and $R_5$, $R_5$ and $R_6$, and $R_6$ and $R_7$ can be joined to each other to form a cyclic structure, and wherein the curing agent includes a phenolaralkyl type phenolic resin having a chemical structure represented by Formula 6, wherein n is in a range of 1 to 7,

[Formula 6]

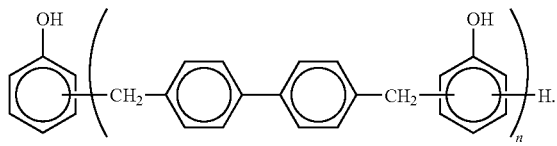

18. The epoxy resin composition as claimed in claim 17, wherein the phenolaralkyl type phenolic resin is present in the epoxy resin composition in an amount of about 20% by weight of the total curing agent.

19. The epoxy resin composition as claimed in claim 17, wherein the phenolaralkyl type phenolic resin is present in the epoxy resin composition in an amount of about 30% of the total curing agent.

* * * * *